United States Patent [19]

Ledbetter

[11] Patent Number: 5,065,101
[45] Date of Patent: Nov. 12, 1991

[54] MINI-RELAY OR REED RELAY TESTER

[75] Inventor: Gary A. Ledbetter, Marysville, Calif.

[73] Assignee: NEC Electronics, Inc., Mountain View, Calif.

[21] Appl. No.: 490,123

[22] Filed: Mar. 7, 1990

[51] Int. Cl.[5] .......................................... G01R 31/02
[52] U.S. Cl. .................................... 324/418; 324/415
[58] Field of Search ...................... 324/449, 418-423; 340/644

[56] References Cited

U.S. PATENT DOCUMENTS

| 2,805,388 | 9/1957 | Brown | 324/422 |
| 4,456,908 | 6/1984 | Morroll et al. | 340/644 |
| 4,764,729 | 8/1988 | Yakuwa et al. | 324/418 X |

FOREIGN PATENT DOCUMENTS 0101472  4/1989  Japan .................................. 324/418

Primary Examiner—Jack B. Harvey
Attorney, Agent, or Firm—Skjerven, Morrill, MacPherson, Franklin & Friel

[57] ABSTRACT

A mini-relay signal tester designed to simplify, speed up, and test the operation of "mini" or "reed" relays which are suspected of intermittent failure. These types of relays are extensively used in memory and gate-array testing systems and their failure can cause the semiconductor devices being tested to be erroneously rejected. The relay tester dynamically exercises the relay being tested by application of a square-wave input signal to its coil. The square wave input "reference" signal driving the relay coil is then compared to a square wave output "test" signal which is generated by the contacts of the relay being tested. The signals are compared on a dual-trace oscilloscope. When difference between signals exceeds acceptable standards the relay is rejected.

7 Claims, 4 Drawing Sheets

MINI-RELAY OR REED RELAY TESTER

FIELD OF THE INVENTION

This invention relates to the testing of mini-relays or reed relays which are commonly used in devices which test semiconductor circuits.

BACKGROUND OF THE INVENTION

Historically, "mini" or "reed" relays are extensively used in memory and gate-array testing systems. These relays are critical in testing semiconductor devices because any increase in resistance (i.e., greater than two ohms) on a relay contact will indicate a faulty connection which causes the semiconductor device being tested to be initially rejected as faulty. Time is wasted re-testing the semiconductor device to determine that the test equipment and not the semiconductor device is at fault. Especially troublesome are relays with "intermittent" failures which occur randomly, because the faulty relay generally cannot be located with a high degree of certainty. In the past, troubleshooting technicians and engineers have used several techniques to attempt to locate relays having intermittent faults. Two of these techniques are the "remove-and-replace" technique and the "bench-repair" technique.

In the "remove-and-replace" technique the troubleshooter through diagnosis of the reported tester malfunction narrows the search for the source of the malfunction to a localized area of the test equipment. The repair person then removes a relay which is thought to be at fault and replaces it with a new relay. If this does not cure the malfunction, it is common to remove and replace additional relays, until the malfunction is eliminated. The removal and replacement of each relay may include time consuming desoldering and soldering.

The "bench-repair" technique requires a power supply, voltmeter, ohmmeter, and several test leads or patch cords. In this technique, the relay suspected of fault is connected by test leads or patch cords to external devices and the suspected relay is statically tested by switching the power to the relay coil on and off and reading an ohm meter connected across the relay contacts. Relays which do not operate according to their input or show a high resistance across their contacts are replaced.

When random intermittent relay failures exist, but the faulty relay cannot be located, significant time and effort is expended to "remove and replace" or "bench-repair" relays which may or may not be at fault, without guaranteed results.

SUMMARY OF THE INVENTION

It is an object of this invention to provide a way to test mini-relays and reed relays with greater efficiency, accuracy, and convenience. This invention rapidly cycles the suspected relays and generates a signal from the cycling relay contacts to identify, with a higher degree of certainty than prior art techniques, those relays which show some evidence of failure or show diminished performance indicative of failure in the immediate future, i.e., higher resistance across relay contacts.

A testing device according to this invention is as follows. The testing device is comprised of a power source, a pulse generator, a relay driving circuit, and a means for monitoring. A "relay under test" also known as a relay being tested, having a coil and a contact, has each of its terminals connected to the relay driving circuit of the testing device. The power source provides power from a battery, preferably a nine-volt D.C. battery, which is routed through a switch and a voltage regulator to the pulse generator. When the switch is closed, the voltage regulator, preferably a 7805 type voltage regulator, controls the output voltage signal to approximately five volts D.C. This voltage signal is then fed to the pulse generator. The pulse generator uses a semiconductor timing device, preferably a 555 type semiconductor timer that has been connected to resistors and capacitors, which provide an RC time constant such that the timer generates a 1,000-Hz square wave output signal, which is provided to an output terminal. The signal from this output terminal, also known as the "reference" signal, is connected to the relay driving circuit. The relay driving circuit is also connected to the power source by a relay driver circuit power source terminal.

The relay being tested has a coil which in the test mode is connected to the relay driving circuit between a power source terminal and a set of Darlington-pair transistors connected to ground. The relay being tested also has a set of contacts connected to the relay driver circuit between the power source terminal and a relay output terminal from which a resistor is connected to ground. The Darlington-pair transistors act as a switch which is operated by the square wave "reference" signal, to alternately connect and disconnect one end of the coil of the relay being tested to and from ground. Each rise and fall of the signal generating the square wave causes the switch to operate. When the relay coil is grounded it is energized by current from the power source, the relay contacts close as soon as the coil is energized. When the contacts close the voltage of the relay output terminal changes. Regular periodic contact movement generates a square wave pattern at the relay output terminal.

When the relay being tested is performing without malfunctions the relay contacts will open and close every time the relay coil is de-energized and energized respectively. Cycling the relay contacts at about 1000 Hz is designed to unmask any hidden intermittent malfunction. Contact opening and closing is observed by monitoring the voltage pattern at the relay output terminal. The voltage pattern generated at the relay output terminal from the opening and closing of the contacts constitutes a square wave "test" signal. The square wave "test" signal is compared, preferably by a dual-trace oscilloscope, to the square wave "reference" signal generated by the pulse generator. When a discrepancy between the "reference" signal and the "test" signal is observed, it is an indication that the relay under test has failed or is failing and therefore should be replaced.

Further explanation of the details of an embodiment of this invention will be described below.

DETAILED DESCRIPTION OF THE INVENTION

Figure 1:
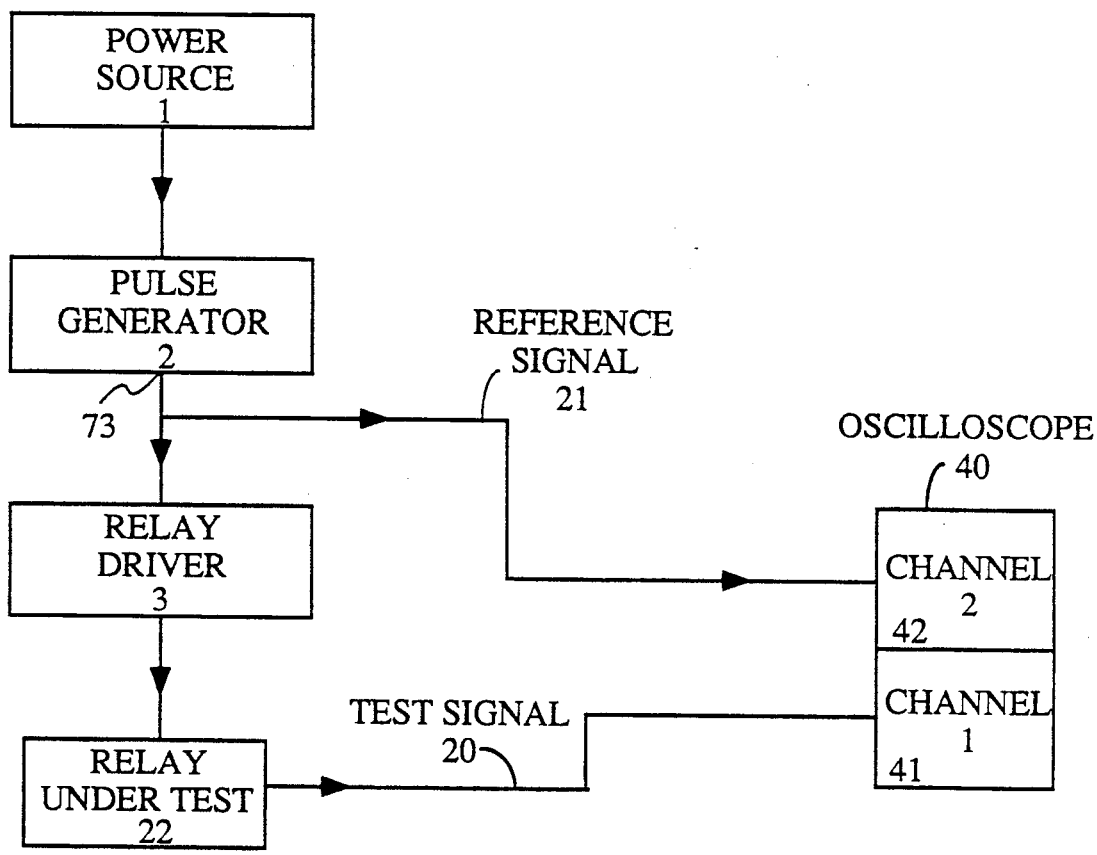
FIG. 1 is a block diagram of a mini-relay testing device.
Figure 2:
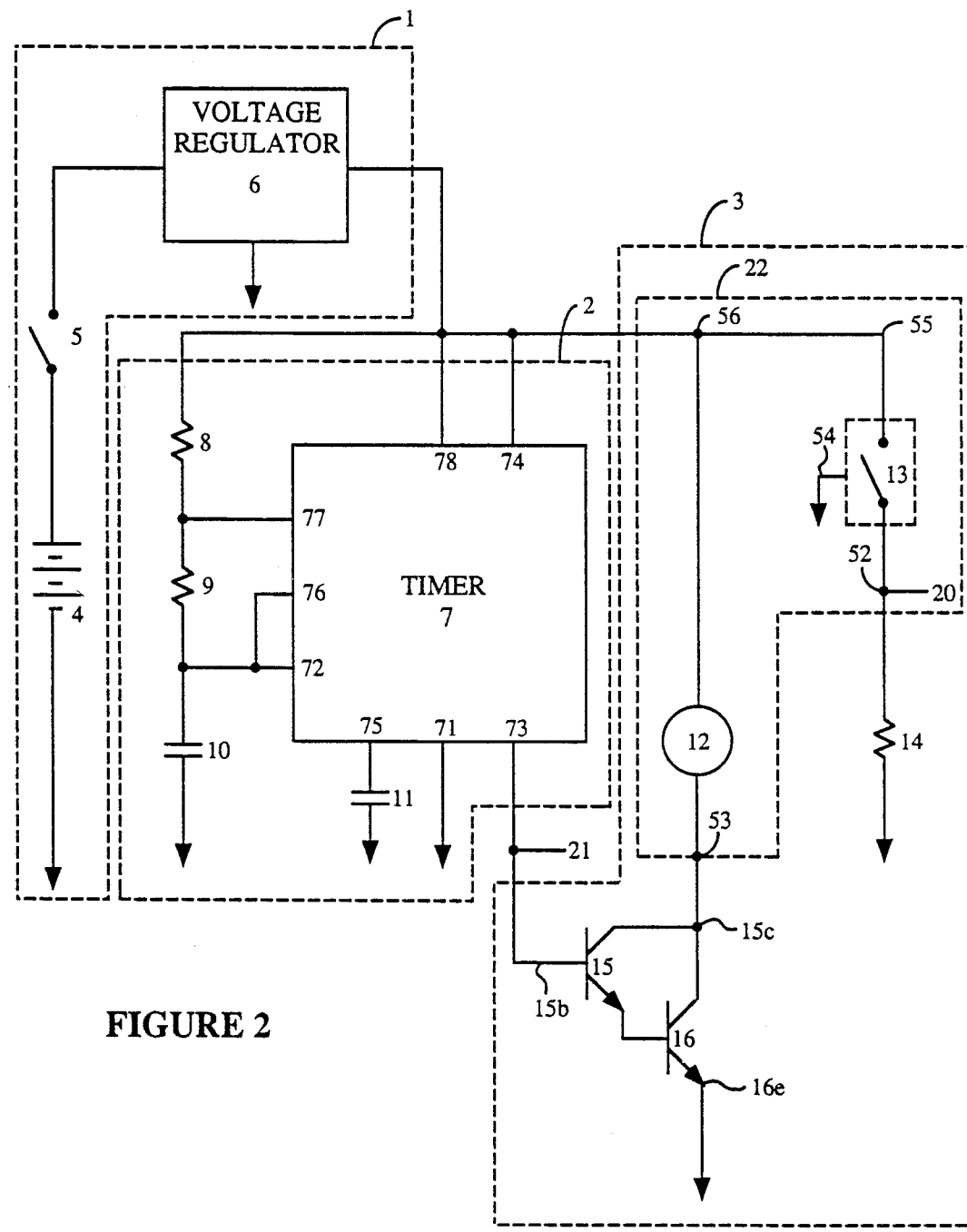
FIG. 2 is a schematic diagram of a mini-relay testing device.

This invention dynamically tests mini and/or reed relays. Referring to FIGS. 1 and 2, the invention generates a square wave "reference" signal 21 to cycle the relay being tested 22. A second "test" signal 20 is generated when the contacts 13 of the relay being tested 22 open and close as the relay coil 12 is energized and de-energized. The "reference" signal 21 and the "test" signal 20 which are generated at separate terminals are compared to determine whether the relay being tested 22 is reacting properly or is faulty.

As shown in FIG. 1, a power source 1 supplies power to a pulse generator 2 which generates a 1,000-Hz square wave output at an output terminal 73 (shown in FIG. 2). The square wave output 21 from the pulse generator 2 is a "reference" signal 21 and is read by the second channel 42 of a dual-trace oscilloscope 40. The output terminal 73 of the pulse generator 2 is also connected to a relay driver 3. The relay being tested (or relay under test [R.U.T.]) 22 is connected to the relay driver 3 in such a way that the coil 12 (FIG. 2 and 4) of the relay under test 22 causes the relay contact 13 to operate according to the square wave "reference" signal 21 received by the relay driver 3 from the pulse generator 2.

The schematic diagram for the circuitry of this device is shown in FIG. 2. The power source 1 consists of a battery 4, preferably of nine volts, connected through a switch 5 to a voltage regulator 6, preferably a 7805-type voltage regulator. The voltage regulator 6 regulates the output voltage to provide a steady five volt DC output signal. This voltage can be any voltage that is approximately the relay coil voltage rating ± (plus or minus) 5%. This five volt DC output signal (power) is connected to a pulse generator 2 which uses a semiconductor timing device 7, preferably a 555-type device, as its nucleus.

The 555 timer 7 is the nucleus of the pulse generator 2 which provides an oscillatory circuit that generates a signal 21 of approximately 1,000 Hz at the output terminal 73. The output signal 21 generated at output terminal 73 is also known as the "reference" signal, which is monitored by a signal-monitoring device, preferably one channel of a dual-trace oscilloscope (42 on FIG. 3).

The 555 timer 7 has eight pins (terminals), which correspond to the standard schematic for a 555 timer. The pin numbers, as illustrated in FIG. 2, correspond to the standard pin number designations with a count of 70 added (i.e., pin labeled 71 is actually pin number 1 in the standard 555 timer configuration). For 555-type devices, the following pin/terminal numbers, as shown in FIG. 2, are identified with their respective functions. Pin 71 is the ground terminal. Pin 72 is the trigger terminal. Pin 73 is the output terminal. Pin 74 is the reset terminal. Pin 75 is the control voltage terminal. Pin 76 is the threshold terminal. Pin 77 is the discharge terminal, and pin 78 is the power source ($V_{cc}$) terminal.

The pulse generator 2 is comprised of the semiconductor timing device 7 having its terminals 71, 72, 73, 74, 75, 76, 77, and 78 connected as follows. The reset terminal 74 and the power source ($V_{cc}$) terminal 78 are connected directly to the output of the voltage regulator 6 and are supplied with five-volt DC power. The discharge terminal 77 is connected to the five-volt DC power source 2 through a resistor 8 having a resistance of approximately 470 kilo-ohms. The trigger terminal 72 and the threshold terminal 76 are connected together and connect to the discharge terminal 77 through a resistor 9 having a resistance of approximately 510 kilo-ohms. The trigger terminal 72 and the threshold terminal 76 are also connected to ground through a capacitor 10 having a capacitance of approximately one nanofarad. The control voltage terminal 75 is connected to ground through a capacitor 11 having a capacitance of approximately 10 nanofarads. The ground terminal 71 is connected directly to ground. The output terminal 73 of the pulse generator 2, as described above, provides a square-wave output signal 21 of approximately 1,000 Hz. This 1,000-Hz signal 21 is also known as the "reference" signal.

The output signal 21 also acts as the input for the relay driving circuit 3 which switches the coil 12 of the relay under test 22 on and off. The relay driver circuit 3 has a transistor; preferably a set of Darlington-pair transistors 15, 16. The Darlington-pair transistors 15, 16 can be considered collectively to have a base junction 15b, a collector junction 15c, and an emitter junction 16e, a.k.a. their (the Darlington-pair transistor's) base junction 15b, their collector junction 15c, and their emitter junction 16e. The base junction 15b receives the square wave input from the pulse generator 2 causing the Darlington-pair transistors 15, 16 to switch the coil 12 on and off. The coil 12 of the relay under test 22 is connected between the power source 1 and ground through the collector 15c and emitter 16e junctions of the Darlington-pair transistors 15, 16. The relay contact 13 of the relay being tested 22 is provided in a resistive circuit between the power source 1 and ground. The circuit has a resistor 14 having a resistance of approximately 970 ohms connected between the relay contacts 13 and ground. When the contacts 13 of the relay under test 22 are closed, a test signal 20, taken from the ground side of the contact 13 and the power source side of the resistor 14, provides an output "test" signal 20 to be compared with the "reference" signal 21.

Figure 3:
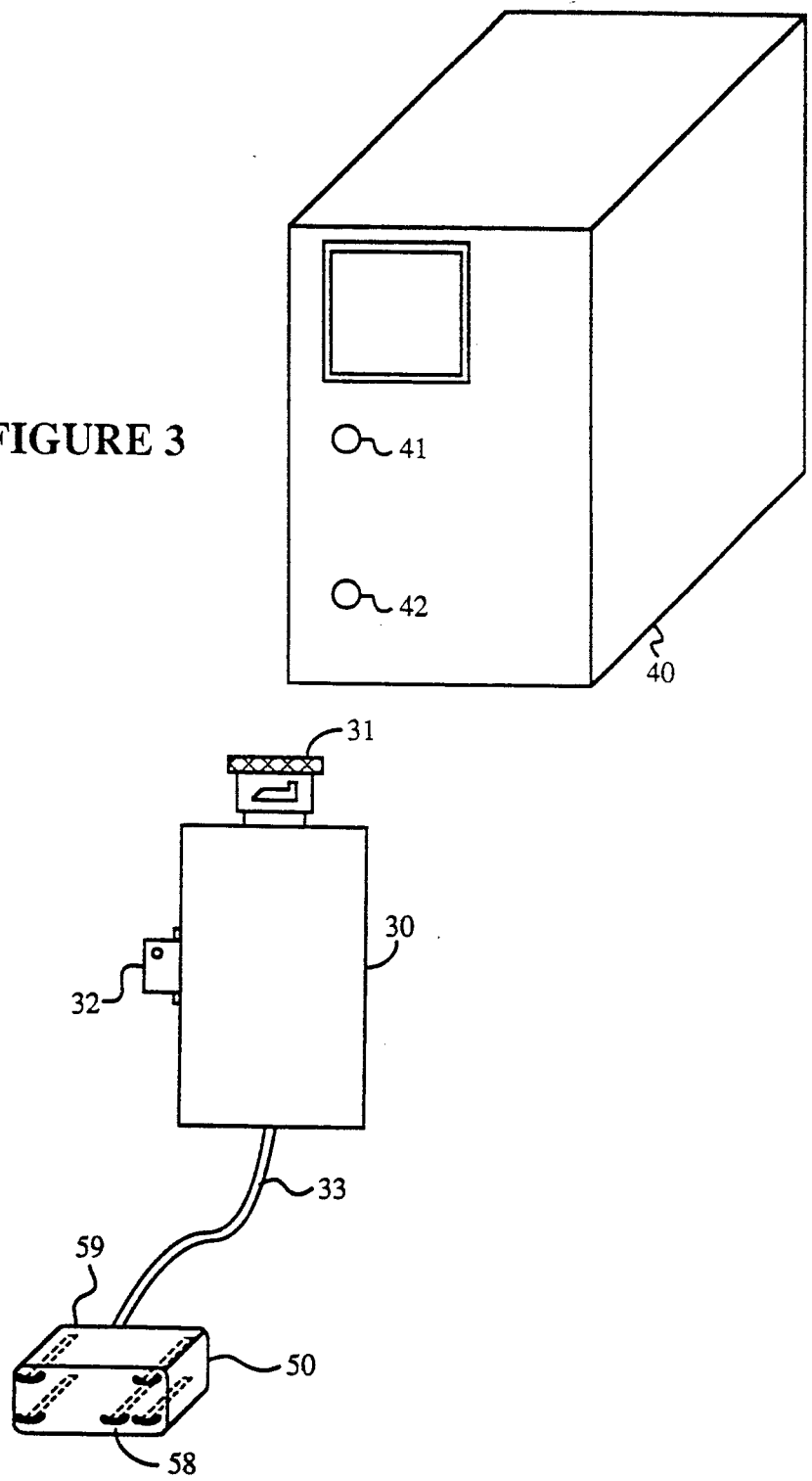
FIG. 3 shows the physical layout of a mini-relay testing device.
Figure 5:
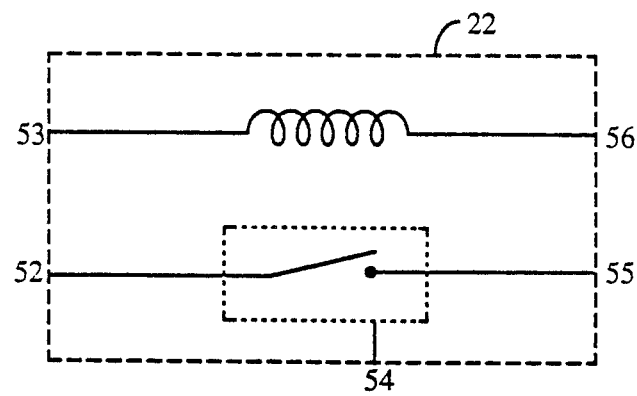
FIG. 5 is the bottom view of the mini or reed relay being tested or a mirror image of a pogo block which provides connections to the mini or reed relay being tested.
Figure 4:
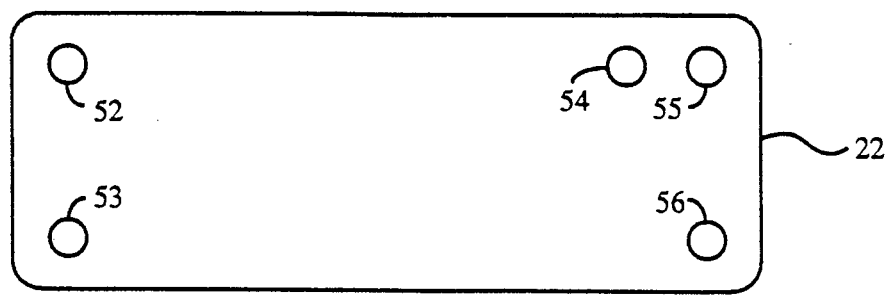
FIG. 4 is a schematic diagram of a mini or reed relay.

FIG. 3 shows the physical layout of the present invention. A testing module 30 contains the power source 1, pulse generator 2, and relay driver circuit 3. The reference output signal 21 is provided to a connector 32, preferably a B.N.C. male connector, which is connected by cabling (not shown) to channel 2 (42) of a dual-trace oscilloscope 40. The test signal 20 is provided to a connector 31, preferably a B.N.C. female connector, and connected directly to channel 1 (41) of the dual-trace oscilloscope 40. The relay under test 22 is temporarily attached to a pogo block 50 connected to the testing module 30 by cabling 33. The pogo block 50 provides spring-loaded rods 58 in an insulated block 59 to which the relay being tested 22 is attached. The rods are electrically connected via the cabling 33 to the testing module 30 and are configurated as shown in FIG. 5, to match the bottom of a mini-relay 22. The spring-loaded rods 58 enable the pogo block 50 to be easily attached to a relay to be tested 22. FIGS. 4 and 5 show the electrical pin connections 52, 53, 54, 55 and 56 of the relay under test 22. FIG. 4 shows the schematic diagram of the relay 22 alone, with its terminals 52, 53, 54, 55, and 56 labeled. The same numbers correspond to terminals as shown in FIGS. 3 and 5. Terminals 52 and 55 connect across the relay contact 13, while terminal 54 provides a connection from the shield around the contacts which can be connected to ground to help shield the contacts from background electro-magnetic fields. Terminals 53 and 56 connect across the relay coil 12.

FIG. 5 is a view of the bottom of a mini or reed relay 22 and a mirror image of the bottom of the pogo block 50 as seen in FIG. 3.

The operation of the invention according to FIG. 3 is as follows. The pogo block 50 is attached to the relay under test 22. The two output terminals 32, 31 of the testing module 30 are connected to each channel 41, 42 of the dual-trace oscilloscope 40. The switch 5 (not shown in FIG. 3) in the testing module 30 is closed and the nine-volt battery 4 supplies power to the 7805 voltage regulator 6. The 7805 voltage regulator 6 regulates its output signal to a positive five volts DC. The positive five volt signal emanating from the voltage regulator 6 enables the pulse generator 2 to provide an approximately 1,000-Hz square-wave signal 21 at its output terminal 73. The signal 21 from the output terminal 73 is the "reference" signal provided to channel 2 (42) of the dual-trace oscilloscope 40. The square-wave signal 21 generated by the pulse generator 2, drives the "base junction" 15*b* of the Darlington-pair transistors 15, 16 of the relay driver circuit 3. The transistors 15, 16 react according to the status of the square-wave signal 21 that is being fed to the base junction 15*b* of the first 15 of the two Darlington-pair transistors 15, 16. Each time a positive voltage is provided by the square-wave signal 21, the Darlington-pair transistors 15, 16 open the electrical path from ground to the coil 12 (between the emitter 16*e* and the collector 15*c* junctions) causing the circuit to be completed and the coil to be energized. This occurs at the same frequency as the square wave received from the pulse generator 2. When functioning properly, each time the coil 12 is energized, the relay contact 13 also closes, causing the "test" signal 20 to change according to the newly observed voltage. A comparison of the oscillation in the voltage signal sent to the coil 12 (the square wave "reference" signal) and the signal received from its contact 13 (the square wave "test" signal) allows a troubleshooter to dynamically review relay operation at the frequency of the pulse generator 2. Once a technician or an engineer compares, preferably visually, the two signals on the dual-trace oscilloscope 40, a judgment of the relay's condition can be made. Intermittent failures during the dynamic testing will cause the relay to be rejected. The technician or engineer must compare the condition of the relay as observed with performance standards for acceptable relays to determine if a relay should be discarded or replaced.

Other embodiments of the invention will be obvious to those skilled in the art in view of the above description which is meant to be illustrative and not limiting.

I claim:

1. A mini-relay signal tester comprising
    a testing module, said testing module comprising,
    a first output terminal connector;
    a second output terminal connector;
    a pulse generator having a terminal connectable to a power source, said pulse generator generating a pulse train at a pulse output terminal;
    means coupling said pulse generator output terminal to said first output terminal connector;
    relay driver circuit means, coupled to said pulse output terminal, connectable to a power source, and connectable to operative terminals of a relay being tested, for controlling energization of a coil of the relay being tested according to said pulse train, and producing at a relay output terminal a signal representative of the opening and closing of an energized set of contacts of the relay being tested; and
    means coupling said relay output terminal to said second output terminal connector.

2. A mini-relay signal tester as in claim 1 further comprising means coupled to said first and second output terminal connectors of said tester for comparing the signal at said first output terminal connector with the signal art said second output terminal connector.

3. A mini-relay as in claim 1 further comprising a power source.

4. A mini-relay signal tester as in claim 1 wherein said relay driver circuit comprises:
    Darlington-pair transistors receiving the output of the pulse generator at their base junction which causes one end of the coil of the relay being tested to be connected and disconnected from ground in response to said pulse train; and
    a connection from the power source to the other end of the coil of the relay being tested.

5. A mini-relay signal tester as in claim 4 wherein the coil of the relay being tested is connected to a collector junction of the Darlington-pair transistors while an emitter junction of the Darlington-pair is connected to ground.

6. A mini-relay signal tester as in claim 1 wherein the relay driver circuit includes means for connecting across the contacts of the relay being tested, such that when the relay coil is energized, the contacts are closed producing a change in the signal at the relay output terminal.

7. A mini-relay signal tester as in claim 1 wherein a resistor separates the relay output terminal from ground.

* * * * *